United States Patent
Hu et al.

(10) Patent No.: US 7,679,591 B2
(45) Date of Patent: Mar. 16, 2010

(54) LIGHT EMITTING DISPLAY DEVICE

(75) Inventors: Shuo-Hsiu Hu, Tainan (TW); Chih-Feng Sung, Miaoli (TW)

(73) Assignee: Au Optronics Corporation, Hsin-Chu (TW)

( * ) Notice: Subject to any disclaimer, the term of this patent is extended or adjusted under 35 U.S.C. 154(b) by 1244 days.

(21) Appl. No.: 10/888,304

(22) Filed: Jul. 9, 2004

(65) Prior Publication Data

US 2006/0017382 A1    Jan. 26, 2006

(51) Int. Cl.
G09G 3/36    (2006.01)

(52) U.S. Cl. .......................................... 345/92; 313/512

(58) Field of Classification Search ......... 313/498–512; 315/169.3; 345/36, 45, 46, 55, 76–83, 84, 345/90, 92
See application file for complete search history.

(56) References Cited

U.S. PATENT DOCUMENTS

| | | | | |
|---|---|---|---|---|
| 4,864,473 | A * | 9/1989 | Tokarz | 362/490 |
| 5,757,125 | A * | 5/1998 | Furlong et al. | 313/503 |
| 6,013,384 | A | 1/2000 | Kido et al. | |
| 6,380,688 | B1 | 4/2002 | Bae et al. | |
| 6,407,508 | B1 | 6/2002 | Kawada et al. | |
| 6,548,960 | B2 * | 4/2003 | Inukai | 315/169.3 |
| 6,577,068 | B2 * | 6/2003 | Matsueda | 315/169.1 |
| 6,579,029 | B1 | 6/2003 | Sevde et al. | |
| 6,593,534 | B2 * | 7/2003 | Jones et al. | 174/262 |
| 2002/0109458 | A1 * | 8/2002 | Pichler et al. | 313/504 |
| 2003/0107534 | A1 * | 6/2003 | Koyama et al. | 345/76 |
| 2003/0184217 | A1 * | 10/2003 | Yamazaki et al. | 313/505 |
| 2004/0124770 | A1 * | 7/2004 | Hayashi et al. | 313/506 |
| 2004/0203185 | A1 * | 10/2004 | Kerr et al. | 438/106 |

FOREIGN PATENT DOCUMENTS

| | | |
|---|---|---|
| TW | 493152 B | 7/2002 |
| TW | 522774 B | 3/2003 |
| TW | 571085 B | 1/2004 |

OTHER PUBLICATIONS

Office Action of corresponding Taiwan patent application mailed on May 29, 2008, 6 pages.
Translation of Office Action to corresponding Taiwan patent application Serial No. 093137166 mailed on May 29, 2008, 4 pages.

* cited by examiner

Primary Examiner—Kevin M Nguyen
Assistant Examiner—Kenneth B Lee, Jr.
(74) Attorney, Agent, or Firm—Duane Morris LLP

(57) ABSTRACT

An electroluminescent display device includes an active matrix organic light emitting diode (AMOLED). A pixel array is formed on a light transmissive substrate and electrically coupled to a common power transmission line and conductive material that substantially fills a channel formed between a cover and the substrate. The channel and the conductive may include a cross-sectional area of about 0.5 to 5 mm$^2$. The conductive material may be a gel, fluid, powder or conductive epoxy and assists the common power transmission line in transmitting power. The substantial cross-sectional area makes the common power transmission line resistant to burn out and is capable of carrying large currents such as needed for display devices having a length or width of 30 inches.

26 Claims, 3 Drawing Sheets

LIGHT EMITTING DISPLAY DEVICE

FIELD OF THE INVENTION

The present invention relates to a light emitting display device.

BACKGROUND

Organic electroluminescent devices such as organic light emitting diodes (OLEDs) are presently of great interest due to their potential application in high efficiency, flat panel displays. OLEDs are described in U.S. Pat. Nos. 6,013,384 and 6,579,029 each of which are hereby incorporated by reference as if set forth in their entireties. OLEDs were originally demonstrated as the light emitting component in passively addressed display products. Passive matrix displays demonstrate the feasibility of OLEDs in many applications, but encounter a fundamental barrier as the display, size and pixel density of the display device increases. Because the luminescent output of an OLED is proportional to the charge injected through the device, the current densities required to operate passively addressed displays rapidly rise as the time available to drive each pixel decreases with increasing display resolution. These higher current densities cause large voltage drops in the indium tin oxide (ITO) or similar interconnect lines of the passive matrix array, push the OLED operation to higher voltages and create display driver issues that are not easily resolved.

In response to such issues, active matrix drive schemes have been developed and active matrix OLEDs (AMOLEDs) are therefore of particular interest. Active matrix technology is a method of sending charges to pixels of a light emitting display. A common example of an active matrix display is a TFT, thin film transistor, commonly formed using polysilicon technology. Whereas a passive matrix display uses a simple conductive grid to deliver current to the pixels of the matrix, an active matrix display uses a grid of transistors with the ability to hold a charge for a limited period of time. Because of the switching action of transistors, only the desired pixel receives a charge, improving image quality over a passive matrix. Furthermore, because of the thin film transistor's ability to hold a charge, the pixel remains active until the next refresh. A goal in AMOLED display technology is to generate a constant current source at each pixel using such thin film transistors. Each pixel is programmed to provide a constant current during the entire frame time, eliminating the high currents encountered in the passive matrix approach. However, unlike LCD-thin film transistor technology, for example, the lighting control of OLEDs is self generated and all of the current supplied to the TFTs to enable the TFTs to drive the OLEDs, flows along a thin layer of conductive material formed on the surface of the substrate and which forms a power transmission line and various interconnect lines within the array. For small arrays such as a 2 square inch array, the current required in the power transmission line that delivers current to the array, may be at manageably low levels such as 300 milliamps. For large displays such as a 30-inch display, the total current needed may increase to 5-10 amps which affects the dependability of the thin power transmission lines conventionally formed on the substrate/array surface. Due to the resistance of the very thin material typically used as conductive interconnects such as ITO (indium tin oxide) aluminum or copper, such a current may result in a potential difference of as much as 27V across the power transmission lines and interconnect lines. Such a potential voltage may cause the interconnect material to burn out, resulting in opens that render the display device inoperable.

Another shortcoming is that the resistance of the thin interconnect materials typically used as power transmission lines and interconnect lines, may produce variable power across the matrix. The lighting intensity of the pixels and therefore can result in a non-uniformly illuminated display.

It would therefore be desirable to provide a display device including an active matrix organic light emitting diode and including a power transmission line capable of accommodating large currents associated with active light emitting devices manufactured to include large dimensions.

SUMMARY OF THE INVENTION

To achieve these and other objects, and in view of its purposes, an aspect of the invention provides a display device comprising a substrate with a common power transmission line formed thereon, a cover joined to the substrate, the cover including a channel, wherein a substantial portion of the channel is at least partially filled with a conductive material that is electronically coupled to the common power transmission line. An array of pixels is electrically coupled to the common power transmission line.

In another aspect, provided is a method for forming a display device. The method comprises providing a substrate with an array of pixels thereon, a conductive interconnect including a common power transmission line for coupling to a power source, and interconnect leads connecting the array of pixels to the common power transmission line. The method further comprises providing a cover including a trench extending inwardly from a contact surface thereof and including a conductive material therein, and joining the cover to the substrate such that the contact surface contacts the substrate and the trench forms a channel in which the conductive material forms a boundary with the common power transmission line.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 1A is a perspective view and FIG. 1B is a front view;

DETAILED DESCRIPTION

Figure 1A:
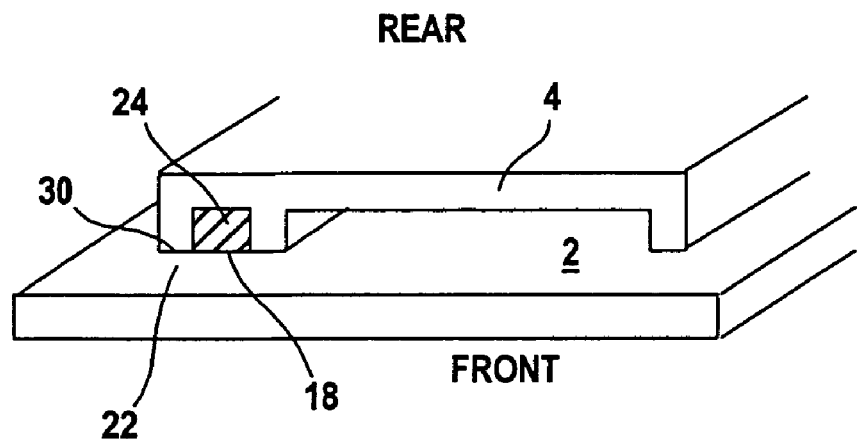
FIGS. 1A and 1B show an exemplary display device of the invention.
Figure 1B:
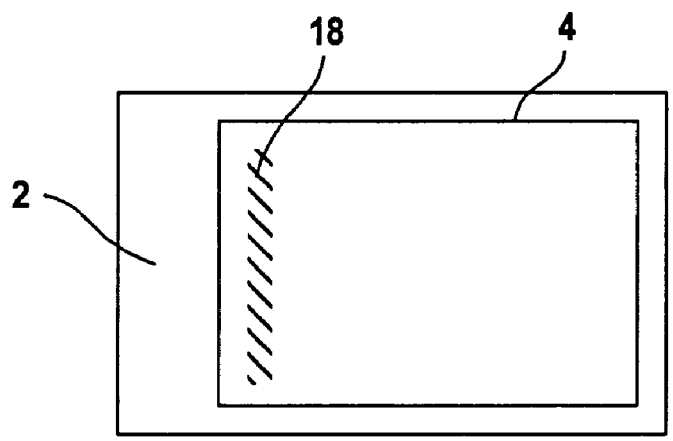

The present invention provides an active light emitting display. In particular, the present invention provides a display device with an array of pixels. In one exemplary embodiment, each pixel may include an OLED and a thin film transistor to provide electroluminescence. A patterned thin film forms an interconnect material that connects the pixels to a common power transmission line and a conductive material of substantial cross-sectional area is electrically connected to the common power transmission line and capable of accommodating large currents. The patterned thin film also forms part of the common power transmission line. In one embodiment, the pixel array of the display device is covered by a cover that includes a trench that is at least partially filled with conductive material. The conductive material is electrically and physically coupled to the common power transmission line that provides power from an external power source to each of the pixels. The conductive material therefore assists the common power transmission line in transmitting power. An exemplary arrangement is shown in FIG. 1A, which shows substrate 2, upon which the pixel array (not shown in FIG. 1A) is disposed, and cover 4. Cover 4 includes trench 24 that is least is partially filled with conductive material 18. When contact surface 30 of cover 4 contacts surface 22 of substrate 2, trench 24 and surface 22 form a channel in which conductive material 18 can transmit power. FIG. 1B is an exemplary front view of the display device shown in FIG. 1A and illustrates cover 4 and conductive material 18 disposed behind substrate 2 and shown by dotted lines. A cross-sectional area of the channel may be about 0.005 to 5 mm$^2$. A cross-sectional area of the conductive material may be about 0.005 to 5 mm$^2$. A thickness of the conductive material may be about 0.01 to 1 mm, but the preceding values are exemplary only and other areas and thicknesses may be used in other exemplary embodiments.

Figure 2:
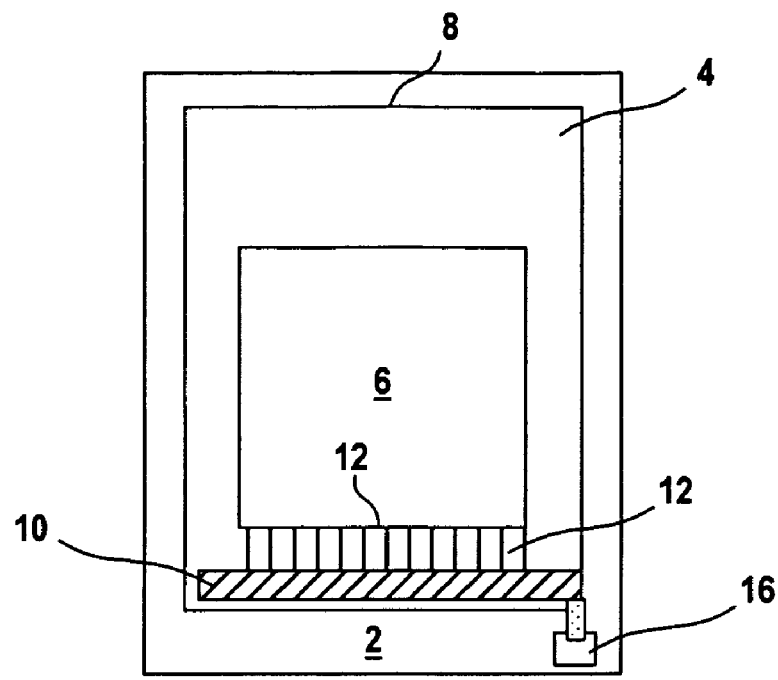
FIG. 2 is a rear view of an exemplary display device according to the present invention.
Figure 3:
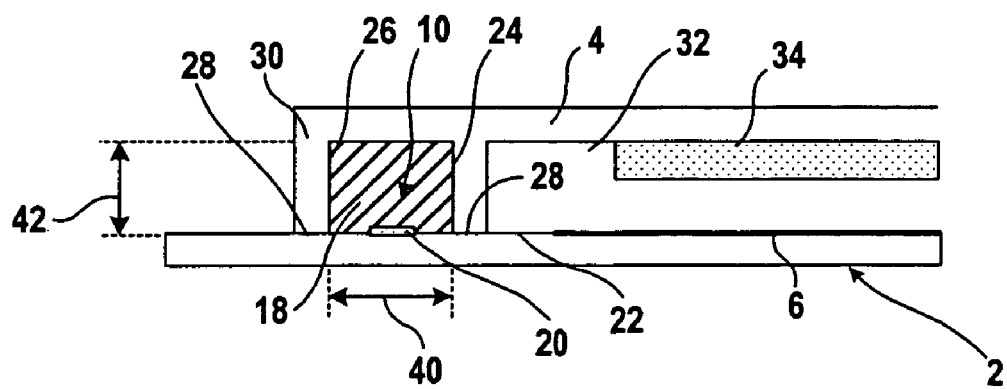
FIG. 3 is a cross-sectional view of an exemplary display device according to the present invention.

FIG. 2 is a top, rear view of an exemplary display device that has a display face on the front, and FIG. 3 is a cross-sectional view showing relevant portions of an exemplary display device. Substrate 2 may be a light transmissive material such as glass, quartz, or various light transmissive plastics. Pixel array 6 is formed on surface 22 of substrate 2. Each pixel comprises an OLED formed on the substrate and associated TFT, according to the exemplary embodiment in which the display device is an active organic light emitting display. Each pixel is connected to common power transmission line 10 by conductive interconnect materials such as interconnect leads 12. The conductive interconnect materials may be formed of indium tin oxide (ITO), aluminum, copper or other suitable conductive materials. The conductive interconnect material formed on substrate 2 and interconnecting the pixels of pixel array 6, are formed from a thin film having a thickness of 500 nanometers (0.5 microns) or less in one embodiment. Cover 4 extends around edge 8 of substrate 2 and common power transmission line 10 is greater in length than the width of pixel array 6 shown in FIG. 2. The display device may be an active light emitting display such as active organic light emitting display or a plasma display.

Common power transmission line 10 may include conductive lead 20 formed within a channel formed between cover 4 and substrate 2 as shown in FIG. 3. Cover 4 includes trench 24 that extends inwardly from contact surface 28 of cover 4. When contact surface 28 of cover 4 contacts surface 22 of substrate 2, trench 24 forms channel 26. In one exemplary embodiment, trench 24 may be defined as the area between two substantially parallel ribs 30 and referred to as a trough. In the illustrated embodiment, channel 26 is substantially filled with conductive material 18, which is electrically connected to common power transmission line 10 and can transmit power. Conductive material 18 may be various conductive materials and in various exemplary embodiments, conductive material 18 may be a liquid or other fluid, a gel, a powder, or other deformable material that can advantageously be placed within, and substantially fill, trench 24. In one exemplary embodiment, conductive material 18 may be a conductive epoxy. Conductive material 18 may be formed by using a metal brazing process, melting a conductive glass frit, performing an eutectic solder or an eutectic brazing process. The conductive material may also be a curable conductive adhesive, which may be cured using ultraviolet radiation or thermal radiation. Various means may be used to cause cover 4 to adhere to substrate 2. In one exemplary embodiment, conductive lead 20 of common power transmission line 10 forms a continuous boundary with conductive material 18. Conductive lead 20 of common power transmission line 10 is also coupled to a plurality of leads (not shown) that extend to pixel array 6 and connect each pixel of pixel array 6 to common power transmission line 10. Conductive lead 20 of common power transmission line 10 may include a thickness of 0.3 to 0.5 microns in an exemplary embodiment.

Figures 4A, 4B:
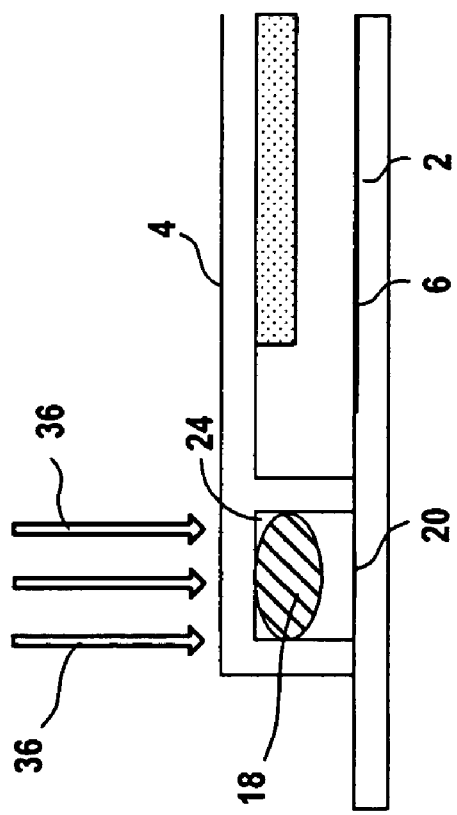
FIGS. 4A and 4B together illustrate a sequence of an exemplary method for forming the conductive common power transmission line of an exemplary display device of the present invention.

In one exemplary embodiment, conductive lead 20 of common power transmission line 10, interconnect leads 12, and the other interconnect leads coupled to the pixels, may be formed from the same thin film of conductive material such as ITO, aluminum, copper or other suitable materials. In an exemplary embodiment, cover 4 may include legs that extend completely around the periphery of cover 4 or other appendages that make continuous contact with substrate 2 to provide an interior 32. In one exemplary embodiment, a desiccant 34 may be sealed within interior 32. Channel 26 includes a cross-sectional area defined by width 40 and height 42. Height 42 may range from 200-300 microns (0.2 to 0.3 mm) to 1.0 mm in one exemplary embodiment but other heights may be used in other exemplary embodiments. In an exemplary embodiment, the area defined by height 42 and width 40 may be in the range of 0.005 to 5.0 mm$^2$ and in an exemplary embodiment may be 0.7 mm$^2$ including width 40 of 2 mm and height 42 of 0.35 mm. In the exemplary embodiment illustrated in FIG. 3, conductive material 18 completely fills channel 26 and therefore includes the same cross-sectional area and dimensions as channel 26. In other exemplary embodiments such as shown in FIG. 4B, conductive material 18 partially fills the cross-sectional area of channel 26, along a substantial length of channel 26.

Power may be applied to the display device through power supply line 14 and power supply contact 16. In this manner, power is supplied to common power transmission line 10 including conductive lead 20, and conductive material 18, and delivered to power to each of the pixels in pixel array 6.

Cover 4 may be joined to substrate 2 using various suitable techniques and adhesives. Conductive material 18 is added to trench 24 prior to joining cover 4 to substrate 2. FIG. 4A is a cross-sectional view showing conductive material 18 disposed within, but not filling trench 24. After cover 4 is joined to substrate 2, various methods may be used to settle or cure conductive material 18 which maybe a fluid, gel, powder, tablets or an epoxy. In one exemplary embodiment, laser light, represented by arrows 36 may be used to cause conductive material 18 to conform to the shape of channel 26 such as shown in FIG. 4B. In another exemplary embodiment, thermal curing can be used. FIG. 4B shows another exemplary embodiment in which conductive material 18 does not completely fill channel 26, but, rather, void area 38 exists. In one exemplary embodiment, conductive material 18 may be a conductive epoxy and the laser light cures the conductive epoxy. Cover 4 is thereby secured in place over substrate 2.

With cover 4 in place, the display device may be powered by connecting a power source to power supply contact 16. When power is applied to the thin film transistor of a pixel, the associated OLED produces light by means of electroluminescence in the embodiment in which the display device is an active organic light emitting display. Various OLEDs formed using various methods, may be used. The common power transmission line is capable of carrying large currents such as a current of 5-10 amps as may be required in a display device having a pixel array having a width or length of 30 inches. The common power transmission line may include a resistance in the range of less than 0.01 ohms and in an exemplary embodiment in which the common power transmission line has a cross-sectional area of 0.7 mm$^2$, it may include a resistance of 0.0046 ohms which is on the order of 1000 times less than conventional common power transmission lines. This produces a voltage drop across the line that is reduced by a factor of 1000 compared to conventional designs. The reduced voltage drop, increased current carrying capacity, and increased cross-sectional area, prevent blow-out of the line and opens.

The preceding merely illustrates the principles of the invention. It will thus be appreciated that those skilled in the art will be able to devise various arrangements which, although not explicitly described or shown herein, embody the principles of the invention and are included within its spirit and scope. For example, although FIG. 2 shows common power transmission line 10 to be longer than pixel array 6, common power transmission line maybe approximately the same dimension or a lesser dimension than the associated length or width of pixel array 6. Additionally, the common power transmission line of the present invention and the channel which receives the common power transmission line may extend along more than one side of the pixel array.

Furthermore, all examples and conditional language recited herein are principally intended expressly to be only for pedagogical purposes and to aid the reader in understanding the principles of the present invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A display device comprising:
   a substrate with a common power transmission line formed thereon;
   a cover joined to said substrate, said cover including a channel substantially located above the common power transmission line, wherein said channel is at least partially filled with a conductive material that is electrically coupled to said common power transmission line and is substantially formed on the common power transmission line, at least a portion of the channel is located above the common power transmission line; and
   an array of pixels electrically coupled to said common power transmission line, wherein the channel of the cover extends horizontally.

2. The display device as in claim 1, wherein said cover comprises a trench having a cross-sectional area that inwardly extends from a contact surface between the cover and the substrate, said trench forming said channel when the cover is joined to the substrate.

3. The display device as in claim 1, wherein said cover covers said substrate and comprises a planar portion substantially parallel to said substrate, and a set of parallel ribs defining a trench therebetween, each of said ribs extending orthogonally from said planar portion and contacting said substrate such that said trench forms said channel.

4. The display device as in claim 1, wherein said channel and said conductive material extend along an edge of said substrate.

5. The display device as in claim 1, wherein said conductive material is a deformable material comprising fluid, gel, or powder.

6. The display device as claim 1, wherein said conductive material comprises a conductive epoxy.

7. The display device as in claim 1, wherein said common power transmission line further comprises a conductive lead formed on said substrate and forming a boundary with said conductive material.

8. The display device as in claim 1, wherein said cover comprises a planar portion substantially parallel to said substrate and comprises appendages that form a continuous seal with said substrate, the cover defining an interior that is separate from the channel, the display device further comprising a desiccant sealed in the interior between said cover and said substrate.

9. The display device as in claim 1, wherein a cross-sectional area of said channel is 0.005 to 5 mm$^2$.

10. The display device as in claim 1, wherein a cross-sectional area of said conductive material is 0.005 to 5 mm$^2$.

11. The display device as in claim 1, wherein said cover comprises glass, plastic or quartz.

12. The display device as in claim 1, wherein a thickness of said conductive material is 0.01 to 1 mm.

13. The display device as in claim 1, wherein said conductive material comprises a conductive adhesive, which is curable using ultraviolet radiation or thermal.

14. The display device as in claim 1, wherein said display device is an active light emitting display.

15. The display device as in claim 14, wherein said display device is an active matrix organic light emitting display and each pixel of said array of pixels comprises a thin film transistor coupled to an associated organic light emitting diode formed on said substrate.

16. The display device as in claim 14, wherein said display device is a plasma display.

17. A method for forming a display device comprising:
- providing a substrate with an array of pixels, a conductive interconnect, and a conductive lead of a common power transmission line disposed thereon, the common power transmission line for providing power from an external power source to the array of pixels, the conductive interconnect for connecting said array of pixels to said conductive lead of the common power transmission line;
- providing a cover comprising a trench extending inwardly from a contact surface thereof and comprising a conductive material therein; and
- joining said cover to said substrate such that said contact surface contacts said substrate and said trench forms a channel in which said conductive material is disposed such that the conductive material forms a boundary along a portion of a length of said common power transmission line,
- wherein the conductive material is configured to assist the common power transmission line in supplying power to the array of pixels from the external power source.

18. The method as in claim 17, further comprising forming said conductive material using a metal brazing process.

19. The method as in claim 17, further comprising forming said conductive material by melting a conductive glass frit.

20. The method as in claim 17, further comprising forming said conductive material performing a eutectic solder.

21. The method as in claim 17, further comprising forming said conductive material by performing an eutectic brazing process.

22. The display device of claim 1, wherein the conductive material forms a continuous boundary along a length of the common power transmission line.

23. A display device, comprising:
- a substrate;
- a pixel array formed on the substrate;
- a common power transmission line having a conductive lead formed on the substrate adjacent to the pixel array, the common power transmission line configured to supply power to the pixel array from an external power source;
- a plurality of interconnect leads formed on the substrate for coupling the pixels of the pixel array to the conductive lead of the common power transmission line;
- a cover joined to the substrate and defining a trench that forms a channel with the substrate, the cover defining an interior that is separate from the channel and disposed over the pixel array;
- a conductive material disposed within the channel and contacting the conductive lead of the common power transmission line to form a continuous boundary along a length of the conductive lead,
- wherein the conductive material is configured to assist the common power transmission line in supplying power from the external power source to the pixel array.

24. The display device of claim 1, wherein the channel of the cover has an opening facing the common power transmission line.

25. The display device of claim 1, wherein the extended direction of the channel is the same as that of the common power transmission.

26. A display device comprising:
- a substrate with a common power transmission line formed thereon;
- a cover joined to said substrate, said cover including a channel substantially located above the common power transmission line, wherein said channel is at least partially filled with a conductive material that is electrically coupled to said common power transmission line and is substantially formed on the common power transmission line; and
- an array of pixels electrically coupled to said common power transmission line, wherein the extended direction of the channel is the same as that of the common power transmission.

* * * * *